United States Patent [19]
Limberg

[11] Patent Number: 5,381,106
[45] Date of Patent: Jan. 10, 1995

[54] CLIPPER CIRCUITRY SUITABLE FOR SIGNALS WITH FRACTIONAL-VOLT AMPLITUDES

[75] Inventor: Allen L. Limberg, Ringoes, N.J.

[73] Assignee: Samsung Electronics Co., Ltd., Kyungki-do, Rep. of Korea

[21] Appl. No.: 967,854

[22] Filed: Oct. 28, 1992

[51] Int. Cl.$^6$ .......................... H03K 5/00; H03K 5/22
[52] U.S. Cl. .................................... 327/104; 330/260; 327/63; 327/309
[58] Field of Search ........................ 307/360, 494, 546; 330/257, 254, 260, 265; 328/26, 32

[56] References Cited

U.S. PATENT DOCUMENTS

| | | | |
|---|---|---|---|
| 3,610,955 | 10/1971 | Blaser et al. | 307/235 |
| 3,787,755 | 1/1974 | Goldner | 328/26 |
| 3,811,098 | 5/1974 | Williams | 328/26 |
| 3,866,063 | 2/1975 | Long | 328/26 |
| 3,958,170 | 5/1976 | Hodgson | 328/26 |
| 4,287,477 | 9/1981 | Carlsen, II et al. | 330/260 |
| 4,307,305 | 12/1981 | Morris | 328/26 |
| 4,333,141 | 5/1982 | Nagano | 328/26 |
| 4,343,018 | 8/1982 | Niimura et al. | 358/28 |
| 4,362,956 | 12/1982 | Ogasawara et al. | 328/26 |
| 4,523,105 | 6/1985 | Jose et al. | 307/261 |
| 4,539,491 | 9/1985 | Nishioka et al. | 330/260 |
| 4,564,814 | 1/1986 | Miura et al. | 328/26 |
| 4,571,520 | 2/1986 | Kimura et al. | 328/26 |
| 4,574,202 | 3/1986 | Ogawa | 307/360 |
| 4,941,080 | 7/1990 | Sieborger et al. | 363/127 |
| 4,994,692 | 2/1991 | Wolke | 307/494 |
| 5,113,146 | 5/1992 | de Jager et al. | 307/494 |
| 5,140,281 | 8/1992 | Fujisawa et al. | 330/257 |
| 5,256,985 | 10/1993 | Brown | 330/260 |

FOREIGN PATENT DOCUMENTS 0019383  2/1981  Japan ................................... 328/26

OTHER PUBLICATIONS

Applications of Operational Amplifiers Jerald G. Graeme 1979.

Measure Differential AC Signals Easily with Precision Rectifiers by Gerald Graeme, Jan. 20, 1975.

"Boost precision rectifier BW above that of op amp used", Jerald Graeme, *Electronic Design News*, Jul. 5, 1974, pp. 67–69.

"Measure differential ac signals easily with precision rectifiers", Jerald Graeme, *Electronic Design News*, Jan. 20, 1975, pp. 45–48.

"Ac-to-dc converters for low-level input signals", Robert Kreeger, *Electronic Design News*, Apr. 5, 1973, pp. 60–62.

*Primary Examiner*—John S. Heyman
*Assistant Examiner*—T. T. Lam
*Attorney, Agent, or Firm*—Sughrue, Mion, Zinn, Macpeak & Seas

[57] ABSTRACT

A clipper includes an amplifier having a non-inverting input node, an inverting input node, and an output node. A feedback transistor has its base connected to the amplifier output node and its collector connected to the non-inverting input node for providing unilaterally conductive degenerative current feedback between the output node and the non-inverting input node. A resistor is connected between the non-inverting input node and an input terminal for conducting a current supplied via the collector-to-emitter path of the feedback transistor which is proportional to the amplitude of an unclipped portion of the signal applied between the input terminal and the inverting input node. When a reference potential is applied to the inverting input node and an AC input signal varying about the reference potential is applied to the input terminal, the stage functions as a negative half-wave rectifier. When the reference potential is applied to the input terminal and the AC input signal is applied to the inverting input node, the stage functions as a positive half-wave rectifier. Two rectifying stages can be interconnected with the collectors of the feedback transistors connected in common to form a full-wave rectifier. The output of the full-wave rectifier can be used to control the gain of an amplifying means producing the AC signal being detected.

34 Claims, 4 Drawing Sheets

CLIPPER CIRCUITRY SUITABLE FOR SIGNALS WITH FRACTIONAL-VOLT AMPLITUDES

This invention relates to clipper and rectifying circuitry useful, for example, in signal rectification and, more particularly, to clipper and rectifying circuitry suitable for signals the amplitudes of which may be only fractions of a volt.

BACKGROUND OF THE INVENTION

A clipper circuit supplies an output signal that, over a prescribed range of an input signal supplied thereto, responds linearly to that input signal. As the input signal swings beyond a boundary of that prescribed range, however, the output signal of the clipper circuit does not change from its value at the boundary. The use of diodes in clipper circuitry is well known. Half-wave and full-wave rectifier circuits are particular examples of clipper Circuitry using diodes, which examples are familiar to persons skilled in the electronics art.

Rectifying circuits are generally capable of wide bandwidth operation and are unconditionally stable. However, the use of diodes is problematic when it is necessary and/or desirable to rectify, or otherwise clip, AC signals whose amplitude may be a fraction of a volt since diodes have a forward voltage drop (VF) of approximately 0.6 volt which must be exceeded before they conduct. Also, diodes suffer the disadvantage of being highly non-linear for AC input signal levels near the "knee" of the diode characteristic curve. This limits the usefulness of clipper and rectifying circuits using diodes to relatively high amplitude level signals of relatively limited dynamic range. Therefore, where it is required to rectify an AC signal which may range from a few millivolts to a few volts the diode circuits discussed above, which are also referred to as "feed forward" type circuits, are not suitable.

To overcome the problem with "feed forward" clipper (e.g., diode rectifying) circuits, rectifier or absolute value circuits capable of linear operation down to small AC signal voltages generally employ feedback techniques to reduce the effect of diode nonlinearities. An example of such a circuit is shown in U.S. Pat. No. 4,564,814 issued 14 January 1986 to Miura et alii and titled FULL-WAVE RECTIFIER USING AN OPERATIONAL AMPLIFIER.

Referring specifically to FIGS. 3 and 4 of the Miura et alii reference, there is shown an operational amplifier combined with a transistor and two resistors to form a full-wave rectifier. A problem with the showing in FIGS. 3 and 4 of the Miura et alii reference is that the mechanism for rectifying the positive-going portion of the AC signal is not similar to the mechanism for rectifying the negative-going portion of the AC signal. Consequently, such a circuit, although simple, will have a response which will not be uniform or symmetrical for positive and negative-going portions of the AC input signal, particularly at high frequencies.

Another approach to obtain full-wave rectification, described in U.S. Pat. No. 4,523,105 issued 11 June 1985 to Jose et alii and entitled FULL-WAVE RECTIFIER CIRCUIT FOR SMALL SIGNALS includes an amplifier with a relatively complex degenerative voltage feedback arrangement to produce bidirectional output currents. In Jose et alii additional inversion of a portion of the bidirectional currents is required before the output currents can be combined to produce full-wave rectification. Thus, the mechanism for rectifying the positive-going half cycle is not the same as for the negative-going half cycle.

Therefore, there is still a need for a simple clipper circuit which has the stability and bandwidth advantages of a feedforward clipper, which has the dynamic range and linearity advantages of a feedback clipper, and which is easily reconnected to respond either to positive portions of an input signal or to negative portions of that input signal with the same predictable gain in either connection.

Furthermore, there is a need for circuits which are suitable for rectifying AC signals whose amplitudes may be a fraction of a volt and which can then use the rectified (or detected) signal to produce a direct current (DC) control voltage for controlling, for example, the gain of an amplifier.

SUMMARY OF THE INVENTION

A circuit embodying the invention includes a differential-input amplifier having a non-inverting input node, an inverting input node, and an output node. A feedback transistor having first and second electrodes defining the ends of a main conduction path and a control electrode has its control electrode connected to the amplifier output node and has its second electrode connected to the non-inverting terminal for providing degenerative current feedback between the output node and the non-inverting input node. A resistive element having a given ohmic value is connected between the non-inverting input node and an input terminal for conducting a current supplied via the main conduction path of the feedback transistor, the first electrode of which defines a current output terminal of the circuit.

Owing to the degenerative feedback, the voltage at the non-inverting input node tends to be very nearly equal to the potential at the inverting input node. This feature enables two alternative ways of detecting the polarity and the amplitude of a signal applied between the input terminal and the inverting input node. In response to the application of a reference potential to the inverting input node and an AC input signal varying about the reference potential to the input terminal, during the negative half cycle of the AC signal a current of one polarity flows through the first electrode of the feedback transistor and through the second electrode of the feedback transistor and the resistive element connected thereto, but during the positive half cycle no current flows. In response to the application of the reference potential to the input terminal and the AC input signal to the inverting input node, during the positive half cycle a current of the same one polarity flows through the first electrode of the feedback transistor and through the second electrode of the feedback transistor and the resistive element connected thereto, but during the negative half cycle no current flows. In both instances the amplitude of the current is a function of the value of the AC signal divided by the ohmic value of the resistive element.

Thus, a circuit embodying the invention is suitable for use as a half-wave rectifier. For one input signal condition (i.e., when the reference potential is applied to the inverting input node and an AC input signal varying about the reference potential is applied to the input terminal), the circuit functions as a negative half-wave rectifier and produces a current of a first polarity at the current output terminal. When the input signal conditions are reversed (i.e., the reference potential is applied to the input terminal and the AC signal is applied to the inverting input node), the circuit functions as a positive half-wave rectifier producing a current of the same first polarity at the current output terminal.

Therefore, first and second circuits embodying the invention may be interconnected to form a full-wave rectifier. In this configuration the input terminal of the first circuit and the inverting input node of the second circuit are connected to a reference potential, the inverting input node of the first circuit and the input terminal of the second circuit are connected to an AC signal varying about the reference potential, and the current output terminals of the first and second circuits are connected in common to produce a full-wave rectified output current proportional to the absolute value of the input AC signal.

In a particular embodiment of the invention, the amplifier includes first and second transistors of a conductivity type complementary to that of the feedback transistor, each complementary-conductivity type transistor, like the feedback transistor, having first and second electrodes defining the ends of a conduction path and a control electrode. The first and second transistors are arranged to form a differential-input amplifier with their first electrodes being connected in common to a first node and with a current source being connected between the first node and a first power terminal. The control electrodes of the first and second transistors define the non-inverting input node and the inverting node, respectively, of the differential-input amplifier and the second electrode of the second transistor defines the output node of the differential-input amplifier. The feedback transistor is connected at its control electrode to the second electrode of the second transistor (which defines the output of the differential amplifier) and its second electrode is connected to the control electrode of the first transistor at the non-inverting node for providing degenerative feedback therebetween and for supplying current to the resistive element connected between the non-inverting input node and the input terminal.

In response to the application of a reference voltage to one of the inverting input node and the input terminal and to the application of an AC signal which goes positive and negative about the reference voltage to the other one of the inverting input node and the input terminal, a unidirectional current flows through the conduction path of the feedback transistor and the resistive element which is proportional to the amplitude of the AC signal divided by the ohmic value of the resistive element. In a particular embodiment of the invention, the first, second, and feedback transistors are bipolar transistors. The first and second transistors are connected in emitter-coupled amplifier configuration; and the feedback transistor has its base connected from the collector of the second transistor and its collector connected to the base of the first transistor for providing feedback from the collector (output) of the second transistor to the base (non-inverting input) of the first transistor. As is the general case with a bipolar transistor, the feedback transistor is a current amplifier, responding to an input signal current of first polarity flowing into its base (input), to supply a first output signal current of the first polarity from its emitter (non-inverting output), and to supply a second output signal current of a second polarity opposite to the first polarity from its collector (inverting output). The feedback transistor functions as a feedback amplifier. It completes a degenerative feedback loop by feeding its collector current back to the base of the first transistor, at the input of the emitter-coupled differential-input amplifier, the collector current of the feedback transistor being an amplified response to a signal current supplied to its base from the collector of the second transistor, at the output of the emitter-coupled differential-input amplifier.

In certain embodiments of the invention, the unidirectional rectified current flowing in the first electrode of the feedback transistor may be converted into a rectified output voltage the amplitude of which is proportional to the absolute value of the AC signal. The rectified output voltage is then applied to a peak detector to produce an output control voltage for controlling the gain of a variable gain amplifier.

DETAILED DESCRIPTION OF THE INVENTION

Figure 1:
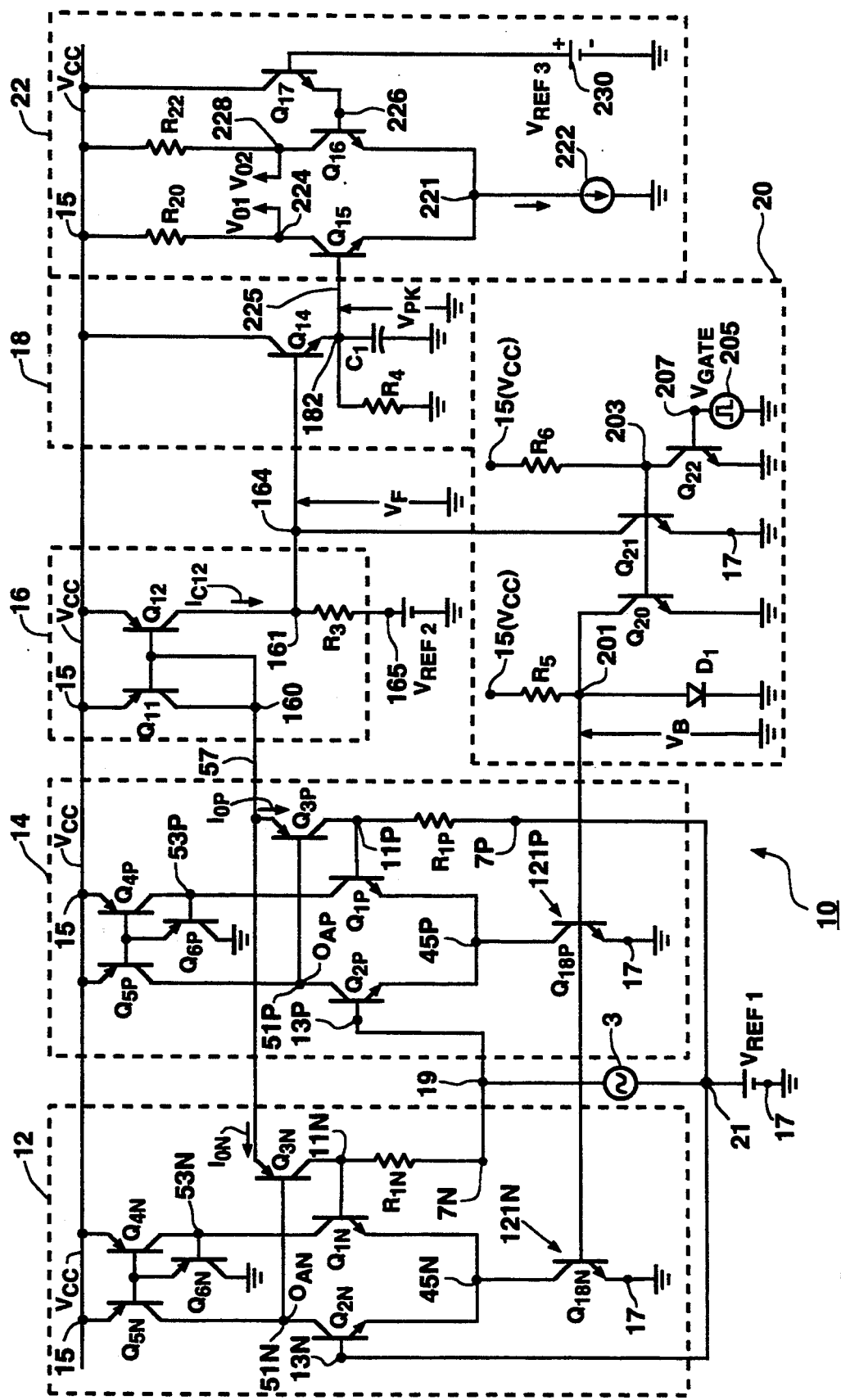
FIG. 1 is a schematic diagram of an amplitude peak detector preceded in cascade connection by a full-wave rectifier embodying the invention.
Figure 2:
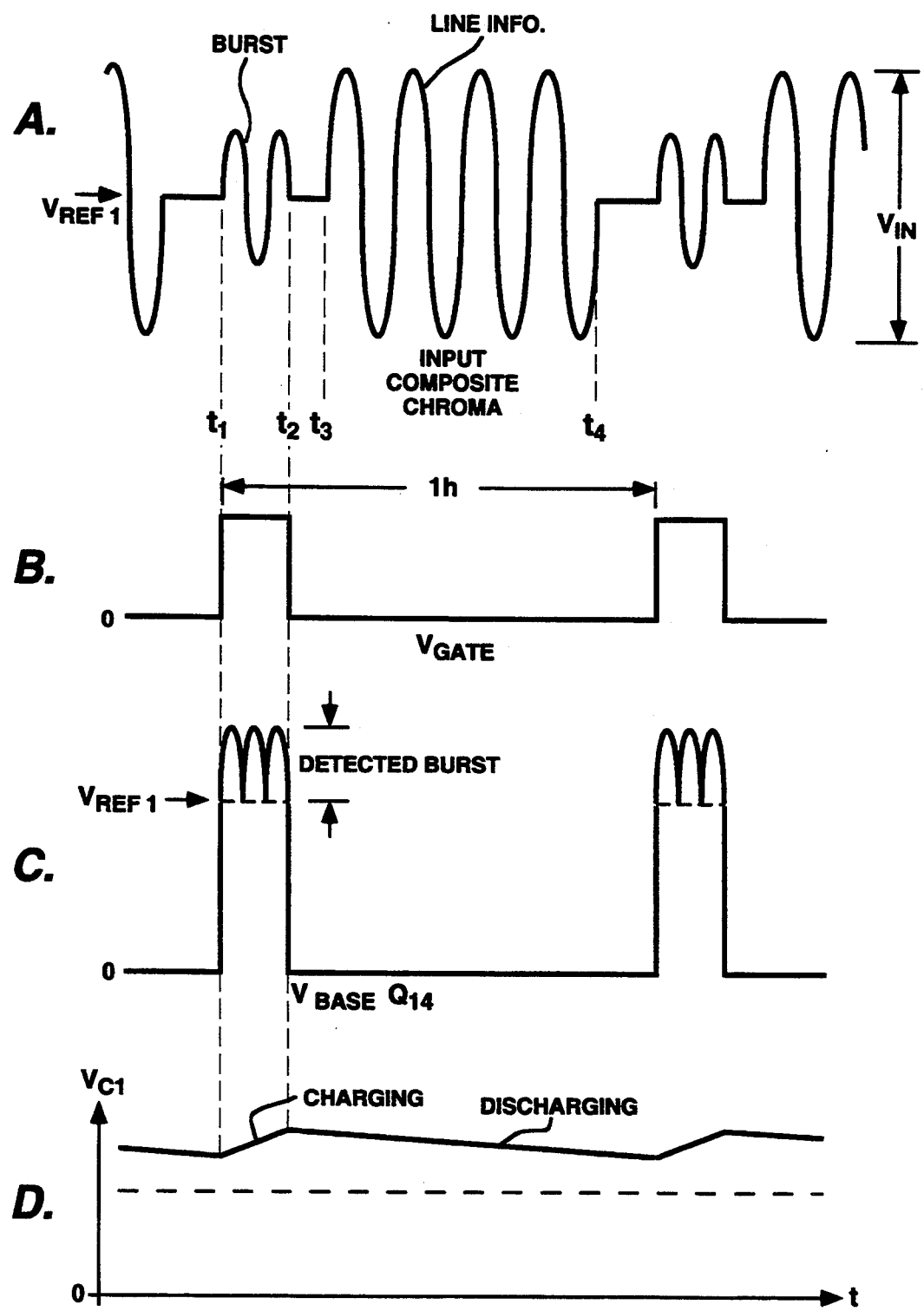
FIG. 2 is a waveform diagram of signals associated with the circuit of FIG. 1.
Figure 3:
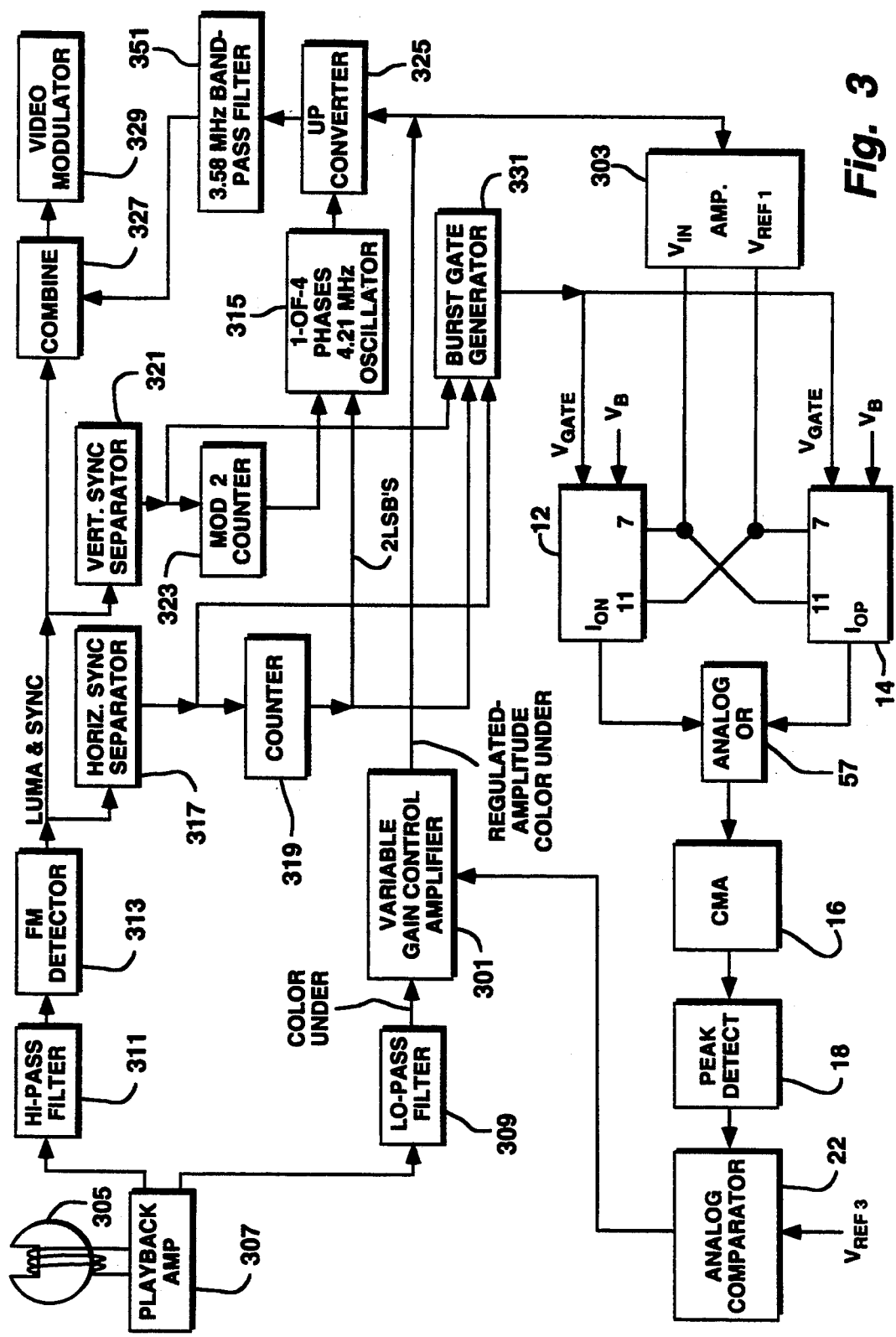
FIG. 3 is block diagram of a playback system for a video cassette recorder (VCR) of the VHS type, which playback system includes a full-wave rectifier embodying the invention.

FIG. 1 is a schematic diagram of a gated detection circuit 10 designed for use in a video cassette recorder (VCR) having playback electronics of the type shown in FIG. 3. More particularly, the gated detection circuit 10 of FIG. 1 is designed for use in an automatic color control (ACC) loop for controlling the gain of a variable gain amplifier 301, which amplifies color-under signal recovered during playback from a previously recorded video tape. The gated detection circuit 10 is designed to detect the "BURST" portion of a color-under signal shown in waveform A of FIG. 2 and to produce a DC control voltage for comparison to a fixed DC level. Deriving the ACC signal from the color-under signal taken directly from the output of the variable gain amplifier 301, rather than from the upconverted response to that signal from the upconverter 325, is an invention claimed by Jack Craft in a concurrently filed application entitled CHROMA BURST DETECTION SYSTEM.

In FIG. 1 the color-under signal, the amplitude and polarity of the "BURST" portion of which is to be detected, is represented as an alternating current (AC) signal $V_{IN}$ produced by a signal source 3 connected between terminals 19 and 21. A reference voltage $V_{REF1}$, which is preferably a direct current (DC) voltage, is applied between terminals 21 and 17. $V_{REF1}$ may be assumed to have a value one-half that of an operating potential $V_{CC}$, which potential $V_{CC}$ may be +5 volts, for example.

The detection circuit 10 of FIG. 1 includes a detector 12 to detect and rectify a negative-going swing of the (AC) signal $V_{IN}$; a detector 14 to detect and rectify a positive-going swing of the (AC) signal $V_{IN}$; a current-to-voltage converter 16; a peak detector circuit 18; a gating and biasing circuit 20 for controlling the turn-on and turn-off of the rectifiers 12 and 14 and of the current-to-voltage converter 16; and an analog comparator 22.

The components of detector 12, which functions as a negative half-wave rectifier, are identified by reference characters followed by the letter "N". The components of detector 14, which functions as a positive half-wave rectifier, are identified by reference characters followed by the letter "P". Detector 12 includes NPN transistors Q1N and Q2N, which are in emitter-coupled differential amplifier connection. That is, the emitters of Q1N and Q2N are connected in common to a node 45N, the base of Q1N is connected to a "non-inverting" input node 11N, the base of Q2N is connected to an "inverting" input node 13N, the collector of Q1N is connected to a node 53N and the collector of Q2N is connected to a node 51N which defines the output (OAN) of the differential amplifier.

A current mirror amplifier (CMA) is connected to the collectors of Q1N and Q2N. The current mirror amplifier includes PNP transistors Q4N, Q5N and Q6N. Transistors Q4N and Q5N have their emitters connected to a power terminal 15 to which the operating potential $V_{CC}$ is applied. The collectors of Q4N and Q5N connect to node 53N and to node 51N, respectively. The collector of the emitter-follower transistor Q6 connects to ground and can be located in the substrate of a monolithic integrated circuit. The base of Q6N is connected to node 53N, and the emitter of Q6N have the bases of Q4N and Q5N connected to it. This current mirror amplifier connection is such that the collector current supplied by the PNP transistor Q5N to the output node OAN is similar to the collector current demanded by the NPN transistor Q1N from the CMA input node 53N.

A selectively enabled, relatively constant current source 121N is connected between node 45N and ground. The current source 121N includes an NPN transistor Q18N having its collector connected to node 45N, its emitter connected to terminal 17 to which is applied ground potential, and its base connected to a terminal 201 to which is selectively applied a relatively constant bias voltage $V_B$.

Unidirectional current feedback between output OAN at the collector of Q2N and the "non-inverting" input at the base of Q1N is provided by the common-emitter-amplifier action of a PNP transistor Q3N having its base connected to the collector of Q2N and its collector connected to the base of Q1N. The emitter of Q3N is connected to a summing line 57.

An input resistor R1N is connected between terminal 11N and input terminal 7N. As discussed in detail below, terminal 7N, which defines one input terminal of the rectifier 12, is connected to terminal 19; and node 11N, which defines another input terminal of the rectifier, is connected to terminal 21.

The structure of positive-swing detector 14 is substantially the same as that of negative-swing detector 12. Positive-swing detector 14 includes NPN transistors Q1P and Q2P which are in emitter-coupled differential amplifier connection. That is, the emitters of Q1P and Q2P are connected in common to a node 45P, the base of Q1P is connected to input node 11P, the base of Q2P is connected to an inverting input node 13P, the collector of Q2P is connected to node 51P defining the output OAP of the differential amplifier and the collector of Q1P is connected to node 53P.

A CMA is connected to the collectors of Q1P and Q2P. The current mirror amplifier includes PNP transistors Q4P, Q5P and Q6P. Transistors Q4P and Q5P have their emitters connected to a power terminal 15 to which the operating potential $V_{CC}$ is applied. The collectors of Q4P and Q5P connect to node 53P and to node 51P, respectively. The collector of the emitter-follower transistor Q6P connects to ground and can be located in the substrate of a monolithic integrated circuit. The base of Q6P is connected to node 53P, and the emitter of Q6P have the bases of Q4P and Q5P connected to it. This current mirror amplifier connection is such that the collector current supplied by the PNP transistor Q5P to the output node OAP is similar to the collector current demanded by the NPN transistor Q1P from the CMA input node 53P.

A selectively enabled relatively constant current source 121P is connected to node 45P. Current source 121P includes an NPN transistor Q18P having its collector connected to node 45P, its emitter connected to ground terminal 17 and a relatively constant bias voltage $V_B$ is selectively applied to the base of Q18P.

Unidirectional current feedback is provided between the output OAP at the collector of Q2P and the "inverting" input at the base of Q1P by the common-emitter-amplier action of a PNP transistor Q3P having its base connected to the collector of Q2P, its emitter connected to the summing line 57, and its collector connected to the base of Q1P. An input resistor R1P is connected between terminal 13P and terminal 7P. Terminal 7P which defines one input terminal of the rectifier 14 is connected to terminal 21, and node 11P which defines another input terminal of rectifier 14 is connected to terminal 19.

On the summing output line 57 the half-wave rectification current $I_{ON}$ produced by negative-swing detector 12 is summed with the half-wave rectification current $I_{OP}$ produced by positive-swing detector 14 in an analog OR or "wired OR" operation. The resulting full-wave rectification current demand on the summing output line 57 is supplied from the input of a current mirror amplifier (CMA) included in a current-to-voltage converter 16. This CMA includes PNP transistors Q11 and Q12 having their emitters connected to terminal 15. The base and collector of diode-connected transistor Q11 and the base of Q12 are connected at a node 160 to which the summing line 57 connects. The collector of Q12 is connected to a node 164 and produces an output current $I_{C12}$, the amplitude of which is proportional to the full-wave rectification current demanded from the input of the current-to-voltage converter 16. A resistor R3 is connected between node 161 and terminal 165 to which is applied a potential $V_{REF2}$. $I_{C12}$ flows through resistor R3 into reference source $V_{REF2}$. The voltage, $V_F$, at node 164 is then equal to $(I_{C12} \cdot R_3) + V_{REF2}$. $V_{REF2}$ may be the same voltage as $V_{REF1}$.

Although shown as simple PNP bipolar transistors, in a monolithic integrated circuit (IC) Q3N, Q3P, Q4N, Q4P, Q5N, and Q5P may in fact be composite transistors each formed from a lateral-structure PNP bipolar transistor and a vertical-structure NPN transistor with the base of the PNP providing the base of the composite transistor, with the emitter of the NPN providing the collector of the composite transitor, with the emitter of the PNP and the collector of the NPN providing the emitter of the composite transistor, and with the collector of the PNP connected to the base of the NPN. As known by IC designers, such a composite transistor provides higher current gain $\beta$ than can be achieved with just a lateral-structure PNP. Q11 and Q12 may also be composite transistors, in which case a substrate PNP transistor is inserted as an emitter follower between node 160 and the joined bases of Q11 and Q12, so Q11 has a sufficiently large "collector"-to-"emitter" potential for exhibiting the expected composite transistor operation.

The peak detector 18 includes an NPN transistor Q14 connected as an emitter follower for positive-going signals, with its collector connected to terminal 15, its base to node 164 and its emitter to node 182. A storage capacitor C1 is connected between node 182 and ground terminal 17 having a value sufficient to hold the peak voltage (VP) at node 182 relatively constant over at least one horizontal line time interval. A discharging resistor R4 is connected in parallel with C1 between node 182 and ground. The value of R4 is selected to assure a slowly decreasing voltage across C1 when no signal is detected.

The output 182 of the peak detector 18 is applied to an input 225 of an analog comparator 22. The comparator 22 compares the output voltage $V_{PK}$ of the peak detector circuit 18 against a reference voltage $V_{REF3}$ to generate output voltages $V_{O1}$ and $V_{O2}$ exhibiting differential variation from each other. The comparator 22 includes NPN transistors Q15 and Q16 in emitter-coupled differential amplifier connection, having their emitters connected in common at node 221. A relatively constant current source 222 is connected between node 221 and ground potential. The base of Q15 is connected to terminal 182, and its collector is connected to an output terminal 224. The base of Q16 is connected to a node 226, and its collector is connected to an output terminal 228. A load resistor R20 is connected between terminal 224 and power terminal 15, and a load resistor R22 is connected between terminals 228 and 15. A biasing signal is applied ;to Q16 by the emitter-follower action of an NPN transistor Q17 connected at its collector to terminal 15 and at its emitter to node 226, to which the base of Q16 is connected. A reference voltage source 230 producing a reference voltage VREF3 is connected to the gate of Q17. VREF3 is typically greater than $V_{REF2}$ and less than $V_{CC}$. $V_{REF3}$ typically sets the level at which the comparator 22 responds to the output of the peak detector. The output signals $V_{O1}$ and $V_{O2}$ at terminals 224 and 228 are applied to variable gain amplifier 301 shown in FIG. 3.

The bias voltage $V_B$ is produced by the potential divider comprising a resistor R5 connected between terminals 15 and 201 and a diode D1 connected between terminal 201 and ground. Diode D1 is poled to conduct current in the forward direction from terminal 201 to ground, whereby the bias voltage $V_B$ developed at terminal 201 is equal to the forward voltage drop, $V_F$, of diode D1 at a particular current. Terminal 201 is connected to the bases of Q18N and Q18P and the voltage at 201 sets the current level through these transistors.

Gating circuitry 20 includes means for controlling the generation and application of the bias voltage $V_B$ and means for selectively either clamping summing output node 164 to ground or letting it respond to the AC input signal. The gating circuit 20 includes a resistor R6 connected between terminals 15 and 203. An NPN transistor Q21 is connected at its base to node 203, at its collector to node 164, and at its emitter to ground terminal 17. An NPN transistor Q20 also has its base connected to terminal 203 and its emitter grounded; the collector of Q20 is connected to bias terminal 201. An NPN transistor Q22 has its collector connected to terminal 203 and its emitter grounded, and its base is connected to a gating terminal 207 to which is applied a source 205 of gating signals.

When the gating signal produced by source 205 is "high" (i.e. sufficiently high to drive transistor Q22 fully on) transistor Q22 is turned-on and clamps the bases of Q21 and Q20 at or close to ground. This turns off conduction through Q20 and Q21. Q20 being turned-off allows current to flow from $V_{CC}$ supply via R5 into diode D1, establishing a forward conduction voltage $V_B$ across diode D1, which voltage $V_B$ is applied to the bases of Q18N and Q18P. So biased, the negative-swing detector 12 and the positive-swing detector 14 are rendered operative. Concurrently, the turn-off of Q21 removes the clamp to ground applied to node 164 and enables the voltage at node 164 to develop a level proportional to the current produced at the joined outputs of the negative-swing detector 12 and the positive-swing detector 14. When enabled, the combination of the negative-swing detector 12, the positive-swing detector 14 and the current-to-voltage converter 16 functions as full-wave rectifier; and the voltage output at node 164 will vary in accordance with the output signals produced by the swing detectors 12 and 14.

When the gating signal is "low" (at or close to zero volts) Q22 is turned-off. Current then flows via R6 into the base of Q21 turning-on conduction through the collector-to-emitter path of Q21 to clamp node 164 at or close to ground potential. Concurrently, current also flows via R6 into the base of Q20 turning-on conduction through the collector-to-emitter path of Q20 to clamp the bases of Q18N and Q18P at, or close, to ground potential. Conduction through Q18N and conduction through Q18P are turned-off, to disable the negative-swing detector 12 and the positive-swing detector 14. Concurrently, the turn-on of Q21 clamps node 164 to ground, preventing any current flow into the peak detector. Thus, when the gate source signal is "high", the full-wave rectifier is enabled and when the gate source signal is low, the full-wave rectifier is disabled.

The operation of the circuit of FIG. 1 will now be examined for the condition when the gating signal is "high" with transistors Q21 and Q20 turned-off. For this condition a voltage $V_B$ is applied to the bases of Q18N and Q18P. The swing detectors 12 and 14 are identical except for the application of the color-under signal $V_{IN}$, the amplitude and polarity of the "BURST" portion of which is to be detected, being to their signal input terminals 13N and 11P, respectively, and for the reference voltage $V_{REF1}$ being applied to their input terminals 11N and 13P, respectively. Since the DC bias condition and response of detector 14 is essentially identical to that of detector 12, the detailed description of their respective modes of operation will be offered with reference to FIG. 5, i) which shows a single detector redrawn without using either of the suffices "N" and "P".

Figure 5:
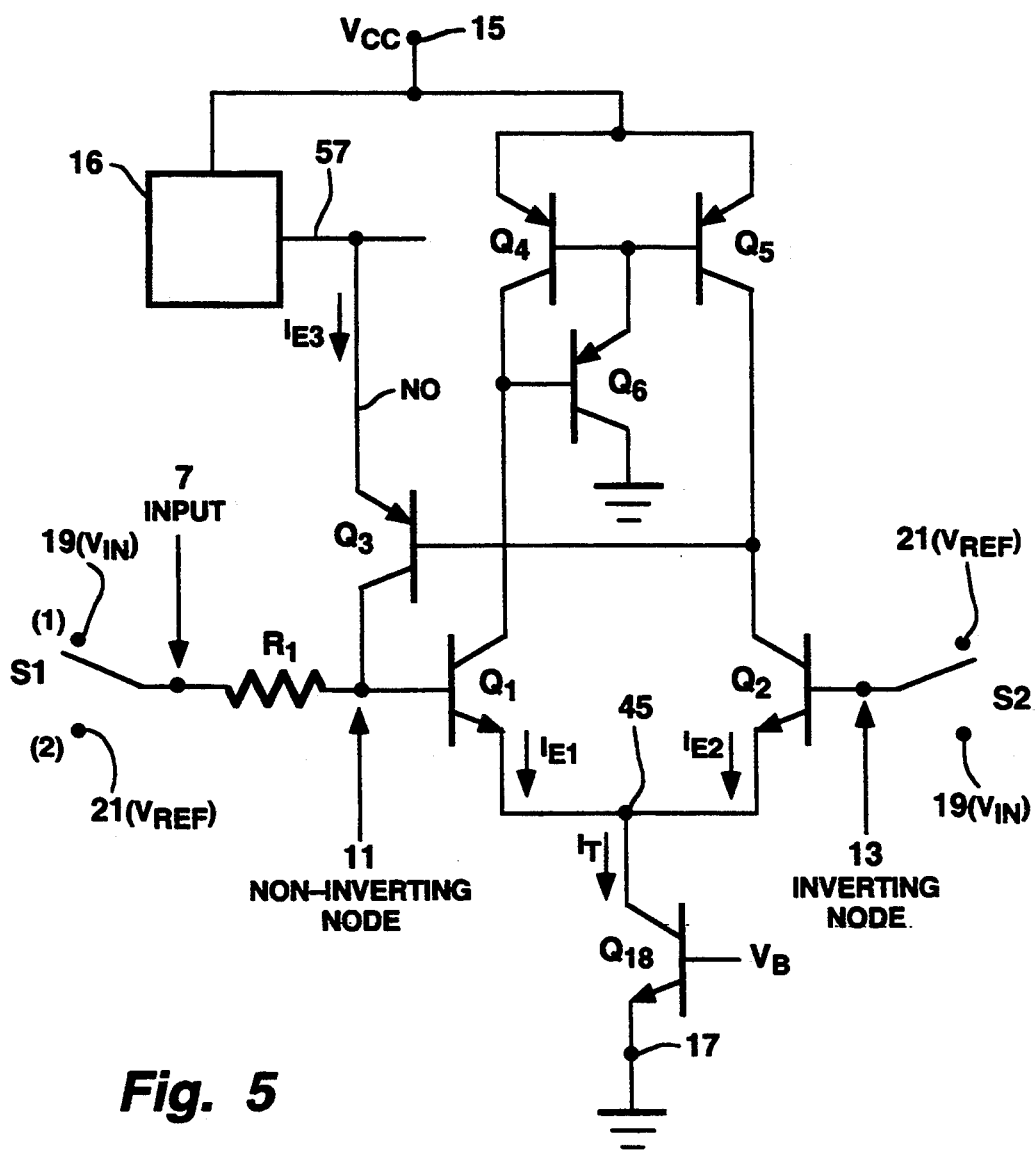
FIG. 5 is a detailed schematic diagram of a circuit embodying the invention.

In FIG. 5, switches S1 and S2 are used to indicate two signal conditions. For condition (1) the switch S1 connects input terminal 7 to terminal 19 to which is applied the AC signal $V_{IN}$ and the switch S2 connects node 13 to terminal 21 to which is applied $V_{REF1}$. This condition corresponds to the operation of detector 12. For condition (2) the switch S1 connects input terminal 7 to terminal 21 to which is applied $V_{REF1}$ and the switch S2 connects node 13 to terminal 19 to which is applied $V_{IN}$. This condition corresponds to the operation of detector 14.

when $V_B$ is applied to the base of Q18, a relatively constant current $I_T$ flows via the collector-to-emitter path of Q18 from node 45 to ground. Assume that a voltage $V_{REF1}$ which is a direct current (DC) voltage and which, for purpose of illustration is assumed to equal $V_{CC}/2$, is applied to the base of Q2. Concurrently, assume that ($V_{IN}+V_{REF1}$), an AC signal $V_{IN}$ superposed on the DC level $V_{REF1}$, is applied to terminal 7 and thence via resistor R1 to the base of Q1. Assuming that initially $V_{IN}$ is equal to zero, it may be assumed that $V_{REF1}$ is initially applied to both the bases of the differential pair of transistors Q2N and Q1N. Assuming Q2N and Q1N to have similar operating characteristics it is evident that, for $V_{IN}=0$, the emitter current $I_{E1}$ of Q1N is equal to the emitter current $I_{E2}$ of Q2N and that $I_T = I_{E1}+I_{E2}$. It may also be assumed that the collector current $I_{C1}$ of Q1 is equal to the collector current $I_{C2}$ of Q2. Assuming Q4 and Q5 to be monolithic integrated-circuit transistors with similar geometries and similar operating characteristics, the collector current drawn by Q1 and flowing through Q4 will induce a like amplitude current to flow through Q5. Neglecting base currents, the collector current from Q4 is approximately equal to the collector current demanded by Q1 and the collector current of Q5 is equal to the collector current demanded by Q2. (In this specification, it is assumed that the forward current gain $\beta$ of the transistors is relatively high and that base current can, to a first approximation, be ignored.)

Hence, for the condition of $V_{IN}=0$ and for $V_{REF1}$ applied to terminals 11 and 7, the bases of Q1 and Q2 are at $V_{REF1}$, the collector current through Q3 is (at most) equal to a small base current flowing through Q2 divided by the $\beta$ of Q3. Hence, for VIN equal to zero, the output collector current $I_{C3}$ of Q3 may be assumed to be essentially equal to zero. That is, the output current $I_O$ to the summing line 57 as determined by $I_{E3}$ is essentially equal to zero.

The above analysis applies for the DC bias conditions of detectors 12 and 14. Hence for $V_{IN}=0$, the output currents $I_{ON}$ of detector 12 and $I_{OP}$ of detector 14 are, at or close, to zero. The response of the circuit of FIG. 1 and in particular the operation of the detector circuits 12 and 14 will now be analyzed for the conditions wherein $V_{IN}$ goes negative relative to $V_{REF1}$ and wherein $V_{IN}$ goes positive relative to $V_{REF1}$.

Referring back to FIG. 5, first consider a condition (1) where the switch S1 applies $V_{IN}$ to terminal 7 and the switch S2 applies $V_{REF}$ to terminal 13, implementing detector circuit 12 operation.

When $V_{IN}$ goes negative with switches S1 and S2 set to condition (1)—i.e. the signal at terminal 7 goes negative relative to the signal at node 11—the voltage at the base of Q1 tends to go negative relative to the voltage at the base of Q2. The voltage at node 45 tends to remain unchanged, following (with a forward-conduction base-emitter junction voltage offset provided by Q2) the higher voltage $V_{REF1}$ present at the base of Q2. The voltage at node 45 being held up tends to decrease the base-to-emitter voltage of Q1 and thus decrease conduction through Q1. Therefore, the current $I_{C1}$ demanded by Q1 from the node 53 decreases, tending to decrease the currents $I_{B4}$ and $I_{B5}$ flowing to node 53 from the bases of Q4 and Q5 and thence to decrease the-current $I_{C4}$ flowing to node 53 from the collector of Q4 to supply only the reduced $I_{C1}$ current demand. By current mirror action, the collector current $I_{C5}$ supplied by Q5 decreases together with the collector current $I_{C4}$ supplied by Q4. Since conduction through Q2 is increasing while $I_{C5}$ collector current is diminishing there is an increased $I_{B3}$ current flow into the base of Q3. The increased $I_{B3}$ current flow into the base of Q3 is multiplied by the common-emitter current gain $\beta$ of Q3 in the current flowing from the collector of Q3 into node 11. The collector current of Q3 flows primarily through the resistor R1 to cause a voltage drop thereacross, which voltage drop increases sufficiently to overcome for the most part the tendency for the base-to-emitter voltage of Q1 to be reduced responsive to $V_{IN}$ at the terminal 7 going negative. Conduction through Q1 is increased, to increase the collector current demanded by Q1 from the input connection of the CMA comprising Q4, Q5 and Q6 and thence the collector current $I_{C5}$ supplied the output from the connection of the CMA. $I_{C5}$ is increased sufficiently to keep $I_{B3}$ just large enough so the collector current $I_{C3}$ from Q3 maintains a voltage drop across R1 substantially equal to ($V_{REF1}-V_{IN}$). That is, the effect of the current feedback to node 11 is that some of the current $I_{C3}$ flows into the base of Q1 and the current levels through Q1 and Q2 are readjusted such that the voltage at node 11 will be maintained at, or close to, the voltage at node 13.

This closed-loop analysis shows that, for node 13 at $V_{REF1}$, when the signal at input terminal 7 tends to decrease the voltage at non-inverting node 13, Q3 will provide sufficient feedback to maintain node 11 at or close to $V_{REF1}$ by withdrawing current therefrom via resistor R1. For the condition of $V_{REF1}$ applied to node 13 and for the AC signal varying negatively about $V_{REF1}$, node 11 functions as a virtual AC ground and will tend to stay at $V_{REF1}$.

Since Q3 can supply all the current needed at node 11 to maintain node 11 equal to $V_{REF1}$, it is evident that as $V_{IN}$ applied to input terminal 7 goes negative, the current flowing through resistor R1 will equal ($V_{REF1}-V_{IN}$)/$R_1$, where $R_1$ is the resistance of R1. Thus the current ($I_1$) through R1 will increase linearly as the AC signal increases in the negative direction. It is also evident that the output current ($I_O$) which is identical to the emitter current $I_{E3}$ of Q3 is essentially equal to the current $I_1$ through R1, since the collector and emitter currents of a bipolar transistor are related in $\beta:(\beta+1)$ ratio and the $\beta$ of a PNP monolithic-integrated-circuit transistor is normally at least 10.

When $V_{IN}$ goes positive with switches S1 and S2 set to condition (1)—i.e. the signal at terminal 7 goes positive relative to the signal at node 13—a current tends to flow from terminal 7 via R1 into the base of Q1. Q1 now tends to conduct more than Q2 and to reduce conduction through Q2. The tendency towards increased conduction through Q1 is accompanied by tendencies for increased conduction through Q4 and through Q5 as well. The desired increase in the collector current $I_{C5}$ cannot be drawn away by the reduced collector current $I_{C2}$ demand Q2, so Q5 tends to divert current from flowing into the base of Q3, thus tending to cut off conduction through Q3. Q5 tends to go into saturated conduction, decreasing the voltage across the base-emitter junction of Q3 below the level to maintain that junction conducting. Therefore, as $V_{IN}$ at terminal 7 goes positive relative to $V_{REF1}$ at terminal 11, conduction through Q3 is turned off; and no $I_{C3}$ emitter current demand is presented by Q3 to the summing line 57.

Thus, it has been shown that the negative-swing detector 12 produces an output current, $I_{ON}$, which increases linearly with $V_{IN}$, when $V_{IN}$ goes negative relative to $V_{REF1}$. Its output current, $I_{ON}$, has been shown to equal zero when $V_{IN}$ increases and goes positive relative to $V_{REF1}$.

The operation of the positive-swing detector 14 is now explained, referring again to FIG. 5, but with switches S1 and S2 set to a condition (2). That is, the switch S1 applies $V_{REF}$ to terminal 7 and the switch S2 applies $V_{IN}$ to the inverting node 13, implementing detector circuit 14 operation.

When $V_{IN}$ goes positive with switches S1 and S2 set to condition (2)—i.e., the potential at node 13 is more positive than the potential at terminal 7—the base of Q2 goes positive with respective to the base of Q1 tending to turn-off Q1. The decreased collector current of Q1 is mirrored via Q4 and Q5 causing a decrease in $I_{C5}$ supplied to node OA. As the voltage on the base of Q2 increases, its collector current $I_{C2}$ increases. Since Q5 tends towards being turned-off, the increased current tends to flow into the base of Q3, causing increases in the collector current $I_{C3}$ of Q3 into node 11 and in the emitter current $I_{C3}$ of Q3 flowing to the summing line 57. The increased current into node 11 raises the voltage at the base of Q1 to a value which is approximately equal to the value of the potential $V_{IN}$ at node 13. Since node 11 is equal to $V_{IN}$ and since input terminal 7 is at $V_{REF1}$, the current $I_1$ flowing through R1 is equal to $(V_{IN} - V_{REF})/R_1$. The current through R1 flows from the collector of Q3, being accompanied by an essentially equal emitter current $I_{E3}$.

When $V_{IN}$ goes negative with switches S1 and S2 set to condition (2)—i.e., the potential at node 13 is more negative than the potential at terminal 7—the base of Q2 goes negative relative to the base of Q1. Since conduction through Q1 increases, the currents through Q4 and Q5 also increase. Thus, as transistor Q2 conducts less current cutting off conduction through the collector-to-emitter path of Q3, there is a tendency for Q5 to supply more current to node 51. This results in saturated conduction through Q5 clamping its collector to the operating potential applied to its emitter, further reducing the base-emitter potential of Q3 and cutting off conduction through the collector-to-emitter path of Q3.

Therefore, analysis of the circuit of FIG. 5 indicates that Q3 supplies sufficient current to maintain the voltage at node 11 equal to the voltage at node 13. For the condition when the input terminal 7 goes negative and node 11 is held at $V_{REF1}$, the current through R1 and Q3 is equal to $(V_{REF1} - V_{IN})/R_1$. Similarly, when the input terminal is held at VREF1 and the potential at node 11 rises with $V_{IN}$, the current flows in the same direction through R1 and Q3 and is equal to $(V_{IN} - V_{REF1})/R_1$. Thus, the positive-swing detector 14 of FIG. 1 has been shown to produce an output current $I_{OP}$ which increases linearly with $V_{IN}$ when $V_{IN}$ goes positive relative to $V_{REF}$. The positive-swing detector 14 has been shown to produce an output current $I_{OP}$ which is equal to zero when $V_{IN}$ goes negative relative to $V_{REF1}$. It should also be evident that detectors 12 and 14 can respond to very small signal differentials. Referring back to FIG. 1, on the summing output line 57, the half-wave rectification current $I_{ON}$ produced by negative-swing detector 12 is summed with the half-wave rectification current $I_{OP}$ produced by positive-swing detector 14 in an analog OR or "wired OR" operation. The resulting full-wave rectification current demand on the summing output line 57 is supplied from the input of the current-to-voltage converter 16.

Figure 4:
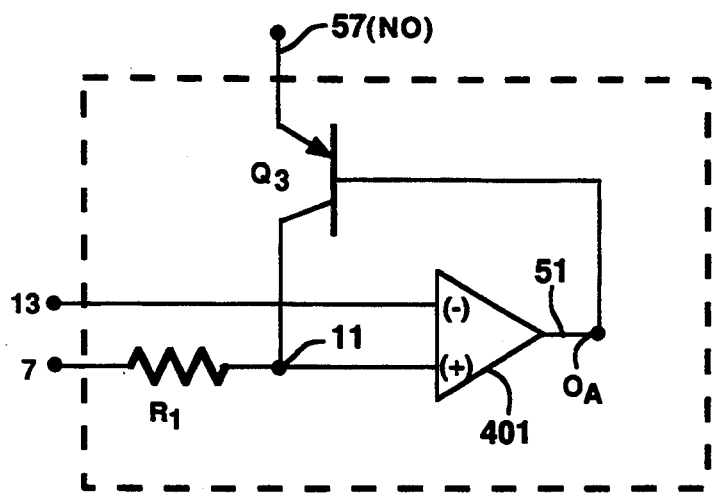
FIG. 4 is a symbolic representation of a circuit embodying the invention.

FIG. 4 represents in a still more general way than FIG. 5 either one of the swing detectors 12 and 14. The FIG. 4 circuit may be viewed more generally than being a rectifier, as being a clipper. The transistors Q1, Q2, Q4, Q5, Q6 and Q18 of the FIG. 5 circuit (when turned-on) together behave like an operational amplifier (op-amp) 401, as shown in the FIG. 4 clipper or swing detector. The base of Q1 corresponds to the op-amp 401 non-inverting (+) input, the base of Q2 corresponds to the op-amp 401 inverting (−) input, and the node 51 between the collectors of Q2 and Q5 corresponds to the output OA of the op-amp 401. The op-amp 401 is an operational transconductance amplifier (OTA) in the FIG. 5 embodiment of the clipper or swing detector. The node or terminal bearing the prefix "11" defines the non-inverting node or terminal (+) of the op-amp 401. The node or terminal bearing the prefix "13" defines the inverting (−) node (or terminal) of the op-amp 401, which also is one of two input terminals of the FIG. 4 clipper or swing detector.

In the FIG. 4 clipper or swing detector considered as a whole, the node or terminal bearing the prefix "11" is one of two input terminals thereto. The node 11 is an internal node which functions as a virtual ground. Resistor R1 connects between node 11 and a terminal bearing the prefix "7", which is the other input terminal of the FIG. 4 clipper or swing detector.

The op-amp 401 is provided degenerative feedback from its output OA to its non-inverting (−) input 11 by a feedback amplifier having an input connection from the output OA of the op-amp 401 and having a non-inverting output connection to node 11 with the resistor R1 as a load. The feedback amplifier has a further output connection to the output terminal of the FIG. 4 clipper or swing detector, shown in FIG. 4 as an non-inverting output connection (IO). The feedback amplifier is shown in FIG. 4 as a common-emitter-amplifier connection of Q3 with the resistor R1 as an emitter load and with the further output connection being from the emitter of Q3 to the non-inverting output connection (NO) of the FIG. 4 clipper or swing detector.

The feedback amplifier provided by the bipolar transistor Q3 connected as a common-emitter amplifier, with the resistor R1 as an emitter load, can be viewed as being a transresistance amplifier, with Q3 functioning as a current amplifying device for driving the resistor R1 as a current-to-voltage conversion element. However, a low-threshold-voltage field-effect transistor in common-drain-amplifier or source-follower connection may replace the bipolar transistor Q3. The difference in the collector currents of Q2 and Q5 charge to stray capacitance at the node OA to provide voltage to which the field-effect transistor is responsive as a transconductive amplifying device. If the op-amp 401 is a voltage amplifier rather than transconductance amplifier, either the bipolar transistor Q3 or a a low-threshold-voltage field-effect transistor wiill function as a transconductive amplifying device cooperating with the resistor R1 as a load to form a voltage amplifier as feedback amplifier.

The FIG. 1 full-wave rectifier and detector circuitry is intended for inclusion in the playback electronics of a video cartridge recorder (VCR) of the VHS type; but, before describing such playback electronics, some background information about VHS recording is provided. In VHS recording, the luminance and chrominance information contained in a composite video signal are separated from each other. The chrominance information supplied for recording is mixed with a one of four phases of 4.21 MHz carrier in a down conversion that generates a color-under signal that comprises quadrature amplitude modulation (QAM) sidebands of a suppressed 629 kHz color-under carrier wave. The phasing of the 4.21 MHz carrier wave is selected on a line-by-line basis as determined by lines and fields of composite video signal, the selection signal being generated by decoding counts of the horizontal and vertical synchronizing pulses separated from the composite video signal. The luminance information is used to frequency-modulate a higher frequency luminance carrier wave. In the resulting FM signal the sync tips are at about 3.4 MHz; black level is at about 3.7 MHz; and white level is at about 4.4 MHz. This FM signal is added to the color-under sidebands as a bias frequency, and the resulting sum signal is pre-emphasized and used to record the video tape vertically scanned by the VCR type transport.

FIG. 3 shows the playback electronics for a video cartridge recorder (VCR) of the VHS type, which the FIG. 1 full-wave rectifier and detector circuitry is designed for inclusion in. When the video tape is played back, the color-under sidebands and the FM signal are separated from each other. A low-pass filter 309 recovers the color-under sidebands, which are supplied to a variable gain control amplifier 301. A high pass filter 311 recovers the FM signal, which an FM detector 313 of the pulse-counting type demodulates in order to reproduce luminance signal with accompanying horizontal and vertical synchronizing pulses.

An oscillator 315 supplies a 4.21 MHz carrier wave, the phasing of which is selected on a line-by-line basis in accordance with counts of lines and fields of composite video signal during playback also, but as obtained by counting horizontal and vertical synchronizing pulses separated from the regenerated luminance signal. More particularly, a horizontal sync separator 317 separates the horizontal synchronizing pulses from the FM detector 313 output signal for counting by a modulo-4 scan line counter 319, and a vertical sync separator 321 separates the vertical synchronizing pulses from the FM detector 313 output signal for counting by a modulo-2 field counter 323.

An up-converter 325 heterodynes the color-under sidebands from the variable gain control amplifier 301 with the one-of-four-phases 4.21 MHz carrier wave from the oscillator 315, thereby regenerating the chrominance sidebands with 3.58 MHz subcarrier. A bandpass filter 351 with 3.58 MHz center frequency responds to the up-converter 325 output signal, to separate the regenerated 3.58 MHz chrominance sidebands from image sidebands. Combining circuitry 327 combines the regenerated 3.58 MHz chrominance sidebands from the filter 351 with the regenerated luminance signal from the FM detector 313 to regenerate composite video signal supplied to a video modulator 329 to modulate the video carrier in a low level television signal transmitter located in the VCR playback electronics.

The peak amplitude of the color-under sidebands is regulated using the variable gain control amplifier 301 prior to mixing with the 4.21 MHz carrier in the up-converter 325. This avoids overloading the mixer in the up-converter 325, while at the same time using the full dynamic range of the mixer. The variable gain control amplifier 301 is advantageously of the type described by Jack Craft in his allowed U.S. patent applicaton Ser. No. 07.896,442 filed 10 June 1992, entitled "CONTROLLED GAIN AMPLIFIER WITHOUT DC SHIFT OR SIGNAL PHASE REVERSAL IN LOAD CURRENT" and assigned to Samsung Electronics, Co., Ltd. The variable gain control amplifier 301 has its gain controlled by an ACC loop that includes, in addition to the variable gain control amplifier 301: an amplifier 303 responding to the color-under signal from amplifier 301 for supplying that signal as referred to the reference voltage $V_{REF1}$, a full-wave rectifier comprising the detectors 12 and 14 for the burst portions of the color-under signal so referred, a current-to-voltage converter 16 responding to full-wave rectified color-under signal color-synchronizing burst signal being withdrawn therefrom by detectors 12 and 14 to supply a full-wave rectified burst voltage added to a pedestal voltage $V_{REF2}$, a peak detector 18 responding to the full-wave rectified burst supplied from the current-to-voltage converter 16 to generate a signal measuring the amplitude of the color-under signal, and a comparator 22 for generating a gain control signal for the variable gain control amplifier 301 depending upon the amount the signal measuring the amplitude of the color-under signal tends to exceed a reference voltage $V_{REF3}$.

The AGC is keyed in nature, with the detectors 12 and 14 being enabled only when supplied a burst gate signal $V_{GATE}$ at the time color burst occurs. The burst gate signal is generated by a burst gate generator 331 receiving horizontal sync pulses from the horizontal sync separator 317 and generating (in response to those sync pulses) a burst gate signal $V_{GATE}$ a prescribed time after each horizontal sync pulse during the scan lines describing a television image and containing color burst information. The burst gate generator 331 may receive the scan line count from the line counter 319 or separated vertical sync pulses from the vertical sync separator 321, as information used to determine when burst gating pulses are to be discontinued during the vertical blanking interval. Both such connections are shown in FIG. 3 although at most just one of them would be used in normal practice.

The keyed AGC of FIG. 3 differs from that encountered in the playback electronics of prior-art VCRs in that the color burst is detected at 629 kHz from the color-under signal before its up-conversion, rather than being detected at 3.58 MHz after the up-conversion. In newer types of VCRs, such as one of the type generally described in U.S. Pat. No. 5,113,262 entitled VIDEO SIGNAL RECORDING SYSTEM ENABLING LIMITED BANDWIDTH RECORDING AND PLAYBACK issued 12 May 1992 to C. H. Strolle et alii, it is desirable to use time-base correctors for the luminance signal, as demodulated from the frequency-modulated luma carrier, and for the color-under signal. U.S. Pat. No. 5,113,262 describes the digital filtering of the time-base corrected color-under signal to separate therefrom chroma sidebands and a motion signal interleaved with those sidebands. The time-base correctors employ digital memory, written in accordance with a time-base derived from the signals recovered during playback of the tape, and read in accordance with a more stable time-base that permits facilitates transversal digital filtering over adjacent scan lines. The luminance signal and the color-under signal must be digitized before they can be written into the digital memory; and in order more effectively to utilize the limited number of bits resolution (e.g., eight) in a cost-effective analog-todigital converter, it is a practical necessity to gain control the color-under signal prior to its digitization. The variable-delay time-base correction and the large number of processing steps between the analog-to-digital converter and the up-conversion of the color-under signal to the normal chrominance band for composite video signal tends to cause tracking problems in an automatic gain control (AGC) loop detecting burst amplitude after that up-conversion, which loop loop can be more particularly characterized as being an automatic color control (ACC) loop.

The detection of color burst at 629 kHz from the color-under signal is more difficult to accomplish than the customary detection of color burst at 3.58 MHz, however, since there is a reduction in the number of cycles available for detection during the burst gate interval. Only one-and-a-half cycles of color burst occur at 629 kHz during the burst gate interval of each scan line. It is no longer convenient to achieve noise-immunity by using keyed synchronous detection. The detection of the peaks of these few cycles of 629 kHz color burst and the filtering to stretch these intermittently detected 629 kHz dolor bursts into a continuous direct control potential for application to the variable gain control amplifier 301 present more problems than the customary detection of color burst at 3.58 MHz. Full-wave rectifier circuitry embodying the invention was developed to overcome these problems.

The operation of the half-wave rectifiers 12 and 14 and the current-to-voltage converter 16 as part of the FIG. 3 chroma burst detector system is more easily explained with reference to the waveform diagram of FIG. 2. Waveform A of FIG. 2 is the AC input signal, $V_{IN}$, applied between terminals 19 and 21 of FIG. 1. Waveform A, which represents the color-under signal referred to $V_{REF1}$ produced at the output of an amplifier 303 shown in FIG. 3, includes a "BURST" signal that occurs between times $t_1$ and $t_2$ and a line information signal that occurs between time $t_3$ and $t_4$. The line information signal comprises QAM sidebands encoding two color-difference signals. The "BURST" signal occurring at a frequency of 629 kHz is a reference signal, and it is important that it be properly detected to control the gain of the amplifier 301.

Referring to the portion of waveform A identified as "BURST", note that the "BURST" signal is an alternating current (AC) signal which goes positive and negative with respect to $V_{REF1}$ and has an amplitude that may range from a few millivolts to more than a volt. Waveform B is a gating signal $V_{GATE}$ which goes high from time $t_1$ to $t_2$. Waveform B is supplied from the burst gate generator 331 of FIG. 3; in FIG. 1 this waveform is generated by the source 205 and applied to terminal 207. As discussed above when $V_{GATE}$ is high, the half-wave rectifiers 12 and 14 are enabled, and when $V_{GATE}$ is low, the half-wave rectifiers 12 and 14 are disabled. Consequently, only when $V_{GATE}$ is high are the positive and negative excursions of the "BURST" signal detected as discussed above, to produce a full-wave detected signal superposed on $V_{REF2}$, as shown in waveform C of FIG. 2.

The full-wave rectified signal ($V_{FN}$) superposed on $V_{REF2}$ is the signal which is generated at node 164 in the FIG. 1 circuitry in response to a "BURST" signal of the type shown in waveform A. The $V_{FN}$ signal at 164 is applied to the base of peak detector transistor Q14, which by emitter-follower action charges capacitor C1 to the value of the signal at node 164 (less a $V_{BE}$ drop).

The voltage ($V_{PK}$) at the output 182 of peak detector 18 increases during a gating period, when $V_{GATE}$ is high, as shown in waveform D of FIG. 2. Following the end of the gating period, the charging capacitor C1 discharges slowly via R4 and the input conductance of the comparator 22, as shown in waveform D. The values of C1 and R4 (and the input conductance of comparator 22) are such that C1 discharges very slowly.

As noted above, during the gating period $t_1$ to $t_2$, conduction through Q20 and conduction through Q21 are turned-off. After the gating period is over (gate signal is low), Q21 conduction through is turned-on to clamp node 164 and the base of Q14 at or close to ground potential. This prevents any signal from being fed from the current-to-voltage converter 16 to the peak detector and thence therethrough to capacitor C1.

The output $V_{PK}$ of the peak detector is applied to the base of Q15 which defines one input of a differential amplifier comprised of Q15, Q16. A reference voltage $V_{REF3}$ is applied to the base of Q17, the emitter voltage ($V_{REF3} - V_{BE}$) of which is applied to the base of Q16 in emitter-coupled differential amplifier connection with Q15. Thus, when the voltage $V_{PK}$ at node 182 is greater than the voltage at the base of Q16, Q15 conducts and the voltage $V_{O1}$ at its collector is less than the voltage $V_{O2}$ at the collector of Q16. On the other hand, when the voltage at node 182 is less than the voltage at the base of Q16, $V_{O1}$ is greater than $V_{O2}$. The push-pull voltages $V_{O1}$ and $V_{O2}$ may be used to control the gain of a amplifier 301 as shown in FIG. 3 and to perform other control functions.

The FIG. 1 amplitude peak detector can alternatively be used to detect the peak amplitude of color burst in an ACC loop where 3.58 MHz color burst is detected. Unlike a keyed synchronous detector, the FIG. 1 amplitude peak detector is not noise-immune. However, the reduction of the amplitude of color-difference signals during noisy conditions is sometimes deliberately sought by VCR and TV set designers. The FIG. 1 amplitude peak detector is simply modified to provide keyed synchronous detection where it is desired. This can be done by connecting the end of the resistor R5 remote from the node 201, not to the continuous operating potential $V_{CC}$, but rather to an operating potential $V_{CC}$ chopped to zero at 3.58 MHz rate. Alternatively, a source of 3.58 MHz square wave current may be applied to the node 201.

The configurations shown in FIGS. 4 and 5 also have more general utility as amplifiers, as one skilled in the art and acquainted with the foregoing specification will appreciate, particularly when one desires an amplifier with signal clipping or keying capability (or both, as in a keyed synchronizing signal separator for television receivers). By way of example, the connection of detectors 12 and 14 shown in FIG. 1 for performing full-wave rectification can be modified for use as a signal corer followed by an absolute-value circuit; this is a function that is used in motion detectors for video signals, for example, where the function is used after determining frame-to-frame differences in the video signals to generate motion indications that exhibit immunity to frame-to-frame random noise. In such modification, the detector 12 input terminal 11N will be offset negatively in potential from the $V_{REF1}$ potential at its input terminal 7N, in order to suppress Q3N collector current response to low levels of negative-going noise; and the detector 14 input terminal 7P will be offset positively in potential from the $V_{REF1}$ potential at its input terminal 11P, in order to suppress Q3 P collector current response to low levels of positive-going noise.

When construing the claims which follow, bear in mind that one skilled in the art will be enabled by acquaintance with the foregoing specification to design a number of variants of the preferred embodiments particularly described and claimed. Such variants are intended to be included within the scope of the broader ones on the following claims.

What is claimed is:

1. A combination comprising:
an input terminal and an output terminal;
a differential-input amplifier having a non-inverting input node, an inverting input node, and an output node;
a feedback amplifier having an input connection to said output node, an inverting first output connection to said non-inverting input node for completing a degenerative feedback loop and for supplying current into said non-inverting input node tending to maintain the potential at said non-inverting input node equal to the potential at said inverting input node, and a non-inverting second output connection to said output terminal;
a resistive element having an ohmic value between said non-inverting input node and said input terminal;
means for applying a reference voltage to one of said inverting input node and said input terminal and for applying an AC signal which varies about said reference voltage to the other one of said inverting input node and said input terminal; and
further circuitry having an input circuit connected from said output terminal, for utilizing a clipped signal current that flows through said output terminal responsive to said AC signal.

2. A combination as set forth in claim 1, wherein said feedback amplifier comprises:
a transistor having first and second electrodes defining the ends of a main conduction path and a control electrode, said first electrode being connected to said output terminal, said second electrode being connected to said non-inverting node, and said control electrode being connected to said output node.

3. A combination as set forth in claim 1:
wherein said differential-input amplifier includes first and second transistors of a first conductivity type, in emitter-coupled differential amplifier connection with each other;
wherein said feedback amplifier includes a third transistor of a second conductivity type complementary to said first conductivity type;
wherein each transistor has first and second electrodes defining the ends of a conduction path and has a control electrode;
wherein said first electrode of said first and second transistors are connected in common and via a current source to a first point of operating potential;
wherein the control electrode of said first transistor and the second electrode of said third transistor are connected to said non-inverting input node;
wherein the control electrode of said second transistor is connected to said inverting input node; and
wherein said second electrode of said second transistor and the control electrode of said third transistor are connected to said output node.

4. A combination as set forth in claim 3 wherein said differential-input amplifier further includes a current mirror amplifier comprising:
fourth and fifth transistors of said second conductivity type, each having first and second electrodes defining the ends of a conduction path and having a control electrode;
means connecting the conduction path of the fourth transistor between the second electrode of the first transistor and a second point of operating potential and the conduction path of the fifth transistor between the second electrode of the second transistor and said second point of operating potential; and
means connecting the control electrodes of said fourth and fifth transistors to the second electrode of said first transistor.

5. A combination as set forth in claim 4 wherein said transistors are bipolar transistors.

6. A combination as set forth in claim 3:
wherein said first, second and third transistors are bipolar transistors; and
wherein, as to each transistor, the first electrode is an emitter, the second electrode is a collector and the control electrode is a base.

7. A combination as set forth in claim 6:
wherein said current source includes a further transistor of said first conductivity type having a base, an emitter and a collector;
wherein said collector of said further transistor is connected to the emitters of said first and second transistors;
wherein said emitter of said further transistor is connected to said first point of operating potential; and
wherein a fixed bias potential is selectively applied to the base of said further transistor only during selected time periods for enabling said current source to supply current during those selected time periods, said selected time periods being separated by intervening time periods during which said current source is not enabled to supply current.

8. A combination as set forth in claim 3 wherein said differential input amplifier further includes:
a current mirror amplifier, having an input connection from the second electrode of said first transistor, and having an output connection to the second electrode of said second transistor.

9. A combination as set forth in claim 8 wherein said current mirror amplifier comprises:
fourth and fifth transistors, each having respective first and second electrodes defining the ends of a respective principal conduction path therethrough, and each having a respective control electrode;
means for connecting the principal conduction path of said fourth transistor between a second point of operating potential and the input connection of said current mirror amplifier;
means for connecting the principal conduction path of said fifth transistor between a second point of operating potential and the output connection of said current mirror amplifier;
a feedback connection from the input connection of said current mirror amplifier to the control electrode of said fourth transistor for conditioning the potential at the control electrode of said fourth transistor to be such as to regulate the current flow through the principal conduction path of said fourth transistor in accordance with the current flow through the second electrode of said first transistor; and means for conditioning the potential at the control electrode of said fifth transistor to be substantially the same as the potential at the control electrode of said fourth transistor.

10. A combination comprising:

first and second signal input terminals for receiving a changing input signal voltage therebetween;

first and second power terminals for the application therebetween of an operating potential;

first, second, and third bipolar transistors of a first conductivity type and a fourth bipolar transistor of a second conductivity type complementary to said first conductivity type, each transistor having a respective base, a respective emitter, and a respective collector;

means connecting the base of said second transistor to said first signal input terminal;

means connecting the base of said fourth transistor to the collector of said second transistor;

means connecting the collector of said fourth transistor and the base of said first transistor to a first node;

resistive means for providing a resistance between said first node and said second signal input terminal;

current supply means connected between said second power terminal and the collectors of said first and second transistors;

means connecting the emitters of the first and second transistors in common to a second node;

means connecting the collector to emitter path of said third transistor between said second node and said first power terminal;

means for selectively applying forward bias to the base electrode of said third transistor to condition its otherwise non-conductive collector to emitter path for conduction, responsive to which conduction the otherwise non-conductive said fourth transistor is conditioned to conduct collector current solely in response to said input signal voltage being of a particular polarity, as tends to cut off conduction of the third transistor collector current through the collector to emitter path of said first transistor and thus increase conduction of the third transistor collector current through the collector to emitter path of said second transistor, thereby to forward bias the base of said fourth transistor conditioning said third transistor to conduct collector current; and means for utilizing, as an output signal, the emitter current of said fourth transistor flowing in response to those portions of said input signal voltage that are of said particular polarity.

11. A combination as set forth in claim 10 further including means for applying a first reference voltage to one of said first and second signal input terminals; and means for applying an alternating current (AC) signal to the other one of said first and second signal input terminals, said AC signal cycling above and below said first reference voltage, for producing a current through said fourth transistor and said resistive means during one-half of each cycle, which current increases as the amplitude of said AC signal increases during said one-half cycle.

12. A combination as set forth in claim 10 further including:

means for applying a first reference voltage to said first signal input terminal; and means for applying an alternating current (AC) signal to said second signal input terminal, said AC signal cycling above and below said first reference voltage, for producing a current through said fourth transistor and said resistive means, which current increases as the amplitude of said AC signal goes more negative than said first reference value and is approximately equal to zero when the amplitude of said second AC signal is positive relative to said first reference value.

13. A combination as set forth in claim 10 further including:

means for applying a first reference voltage to said second signal input terminal; and means for applying an alternating current (AC) signal which cycles above and below said first reference voltage to said first signal input terminal for producing a current through said fourth transistor and said resistive means, which current increases as the amplitude of said AC signal goes more positive than said first reference value and is approximately equal to zero when the amplitude of said second AC signal is negative relative to said first reference value.

14. A combination as set forth in claim 10 wherein said current supply means connected between said second power terminal and the collectors of said first and second transistors comprises:

a current mirror amplifier, having an input connection from the second electrode of said first transistor, having an output connection to the second electrode of said second transistor, and having a common connection to said second power terminal.

15. A combination as set forth in claim 14 wherein said current mirror amplifier comprises:

fifth and sixth transistors, each having respective first and second electrodes defining the ends of a respective principal condition path therethrough, and each having a respective control electrode;

means for connecting the principal conduction path of said fifth transistor between the common and input connections of said current mirror;

means for connecting the principal conduction path of said sixth transistor between the common and output connections of said current mirror;

a feedback connection from the input connection of said current mirror to the control electrode of said fifth transistor for conditioning the potential at the control electrode of said fifth transistor to be such as to regulate the current flow through the principal conduction path of said fifth transistor in accordance with the current flow through the second electrode of said first transistor; and means for conditioning the potential at the control electrode of said sixth transistor to be substantially the same as the potential at the control electrode of said fifth transistor.

16. A combination comprising:

first and second signal input terminals;

first and second power terminals for the application therebetween of an operating potential;

first and second transistors of a first conductivity type and a third transistor of a second conductivity type complementary to said first conductivity type, each transistor having first and second electrodes defining the ends of a conduction path and a control electrode;

means connecting the first electrodes of the first and second transistors in common to a first node;

means connecting a selectively enabled current source between said first node and said first power terminal for causing said first and second transistors to function as a differential amplifying stage only when said current source is enabled;

means connecting the control electrode of said third transistor to the second electrode of said second transistor;

means connecting the control electrode of said second transistor to said first signal input terminal;

means connecting the second electrode of said third transistor and the control electrode of said first transistor to a second node;

means for providing a resistive path for current between said second node and said second signal input terminal, which resistive path exhibits a resistance of value R between said second node and said second signal input terminal;

current supply means connected between said second power terminal and the second electrodes of said first and second transistors;

means for applying an alternating current (AC) signal between said first and second signal input terminals and for, in response thereto, producing a unidirectional output current via the conduction path of said third transistor, the amplitude of which unidirectional output current is a function of the amplitude of the AC signal divided by R; and further circuitry having an input circuit connected between first electrode of said third transistor and said second power terminal to which said unidirectional output current is supplied for utilization.

17. A combination comprising:

an input signal terminal for the application thereto of an input signal, portions of which that are more negative than a first reference potential or that are more positive than a second reference potential are to be detected on an absolute-value basis during gating intervals;

first selectively enabled clipping means connected to receive said input signal from said input signal terminal, said first clipping means having an output terminal for supplying a respective output signal linearly responsive to the portions of said input signal that are more negative than said first reference potential;

second selectively enabled clipping means connected to receive said input signal from said input signal terminal, said second clipping means having an output terminal for supplying a respective output signal linearly responsive to portions of said input signal that are more positive than said second reference potential; and means for summing the output signals of said first and second clipping means for producing a combined output signal detecting on an absolute-value basis portions of said input signal that swing beyond a first reference potential in a direction away from a second reference potential or that swing beyond said second reference potential in a direction away from said first reference potential—wherein said first clipping means includes:

a) a first resistive element having a first end connected to said input signal terminal, having a second end, and exhibiting a first ohmic value between its first and second ends;

b) a first differential-input amplifier having an inverting input node to which said first reference potential is applied, having a non-inverting input node connected to the second end of said first resistive element, and having an output node; and c) first current feedback amplifying means having an input connection from the output of said first differential-input amplifier, having a common connection to the output terminal of said first clipping means, and an output connection to the non-inverting input node of said first differential-input amplifier—and wherein said second clipping means includes:

d) a second resistive element having a first end connected to said input signal terminal, having a second end, and exhibiting a second ohmic value between its first and second ends;

e) a second differential-input amplifier having a non-inverting input node to which said second reference potential is applied, having an inverting input node connected to the second end of said second resistive element, and having an output node; and f) second current feedback amplifying means having an input connection from the output node of said second differential-input amplifier, having a common connection to the output terminal of said second clipping means, and having an output connection to the non-inverting input node of said second differential-input amplifier.

18. A combination as set forth in claim 17 wherein said first and second reference potentials are the same as each other, said first and said second selectively enabled clipping means thereby respectively being first selectively enabled rectifying means and second selectively enabled rectifying means.

19. A combination as set forth in claim 18 wherein said first and second selectively enabled rectifying means are enabled during said gating interval; and wherein said gating interval is generated by a burst gate generator at a time that a chroma burst signal can be expected to occur.

20. A combination as set forth in claim 19 further including: current to voltage conversion means connected for responding to current from said summing means to produce a full-wave rectified voltage proportional to the absolute value of said AC signal during said gating interval.

21. A combination as set forth in claim 20 further including:

peak detection means connected for detecting peaks of voltage from the current to voltage conversion means, and low pass filter means following said peak detection means.

22. A combination as set forth in claim 21 further including:

control means coupled to said low pass filter means and responsive thereto to produce a control signal coupled to a variable gain amplifier.

23. A combination comprising:

an input signal terminal for the application thereto of an input signal, portions of which are to be detected on an absolute-value basis;

first clipping means connected to receive said input signal from said input signal terminal, said first clipping means having an output terminal for supplying a respective output signal linearly responsive to the portions of said input signal that are more negative than a first reference potential;

second clipping means connected to receive said input signal from said input signal terminal, said second clipping means having an output terminal for supplying a respective output signal linearly responsive to the portions of said input signal that are more positive than a second reference potential; and means for summing the output signals of said first and second clipping means for producing a combined output signal detecting on an absolute-value basis portions of said input signal that swing beyond a first reference potential in a direction away from a second reference potential or that swing beyond said second reference potential in a direction away from said first reference potential—wherein said first clipping means includes:

a) a first resistive element having a first end connected to said input signal terminal, having a second end, and exhibiting a first ohmic value between its first and second ends;

b) a first differential-input amplifier having an inverting input node to which said first reference potential is applied, having a non-inverting input node connected to the second end of said first resistive element, and having an output node; and c) first current feedback amplifying means having an input connection from the output node of said first differential-input amplifier, having a common connection to the output terminal of said first clipping means, and an output connection to the non-inverting input node of said first differential-input amplifier—and wherein said second clipping means includes:

d) a second resistive element having a first end connected to said input signal terminal, having a second end and exhibiting a second ohmic value between its first and second ends;

e) a second differential-input amplifier having a non-inverting input node to which said second reference potential is applied, having an inverting input node connected to the second end of said second resistive element, and having an output node; and f) second current feedback amplifying means having an input connection from the output node of said second differential-input amplifier, having a common connection to the output terminal of said second clipping means, and having an output connection to the non-inverting input node of said second differential-input amplifier.

24. A combination as set forth in claim 23 wherein said first and second reference potentials are the same as each other, said first and said second clipping means thereby respectively being first rectifying means and second rectifying means.

25. A combination as set forth in claim 23 wherein said first current feedback amplifying means is a first current amplifier and said second current feedback amplifying means is a second current amplifier.

26. A combination as set forth in claim 23, wherein said means for summing the output signals of said first and second clipping means for producing a combined output signal comprises a current mirror amplifier having an input connection to the common connections of both said first current feedback amplifying means and said second current feedback amplifying means and having an output connection for supplying said combined output signal.

27. A combination as set forth in claim 26 further including:

an amplitude detector for detecting the amplitude of said combined output signal.

28. A combination as set forth in claim 23 further including:

an amplitude detector for detecting the amplitude of said combined output signal.

29. A combination as set forth in claim 17 wherein said first current feedback amplifying means is a first current amplifier and said second current feedback amplifying means is a second current amplifier.

30. A combination as set forth in claim 17, wherein said means for summing the output signals of said first and second clipping means for producing a combined output signal comprises a current mirror amplifier having an input connection to the common connections of both said first current feedback amplifying means and said second current feedback amplifying means and having an output connection for supplying said combined output signal.

31. A combination as set forth in claim 30 further including:

an amplitude detector for detecting the amplitude of said combined output signal.

32. A combination as set forth in claim 17 further including:

an amplitude detector for detecting the amplitude of said combined output signal.

33. A full-wave rectifier comprising, in addition to first and second input signal terminals and an output signal terminal, the following elements:

a) a first differential-input amplifier having a respective inverting input node connected to said first input signal terminal, having a respective non-inverting input node, and having a respective output node;

b) a first feedback amplifier having a respective input connection from the output node of said first differential-input amplifier, having a respective output connection to the non-inverting input node of said first differential-input amplifier for providing degenerative feedback thereto, and having a common connection through which a first current flows;

c) a first resistive element having an ohmic value connecting between said non-inverting input node of said first differential-input amplifier and said second input signal terminal, said elements (a) and (b) and (c) cooperating to provide a first half-wave rectifier stage;

d) a second differential-input amplifier having a respective inverting input node connected to said second input signal terminal, having a respective non-inverting input node, and having a respective output node;

e) a second feedback amplifier having a respective input connection from the output node of said first differential-input amplifier, having a respective output connection to the non-inverting input node of said second differential-input amplifier for providing degenerative feedback thereto, and having a common connection through which a second current flows;

f) a second resistive element having an ohmic value connecting between said non-inverting input node of said second differential-input amplifier and said first input signal terminal, said elements (d) and (e) and (f) cooperating to provide a second half-wave rectifier stage; and g) summing means connecting the common connections of said first and second feedback amplifiers together at said output signal terminal for said full-wave rectifier for combining said first and second currents.

34. A full-wave rectifier as set forth in claim 33 in combination with:

means for applying a reference potential to said first input signal terminal, and means for applying to said second input signal terminal an AC voltage superposed on said reference potential.

* * * * *